(12) United States Patent
Suehiro et al.

(10) Patent No.: US 6,834,977 B2
(45) Date of Patent: Dec. 28, 2004

(54) LIGHT EMITTING DEVICE

(75) Inventors: Yoshinobu Suehiro, Aichi-ken (JP); Yuji Takahashi, Aichi-ken (JP); Hideaki Kato, Aichi-ken (JP); Koichi Kaga, Aichi-ken (JP); Kiyotaka Teshima, Tokyo (JP); Shunsuke Ohtsuka, Tokyo (JP)

(73) Assignees: Toyoda Gosei Co., Ltd., Aichi-ken (JP); Koha Co., Ltd., Tokyo (JP)

( * ) Notice: Subject to any disclaimer, the term of this patent is extended or adjusted under 35 U.S.C. 154(b) by 207 days.

(21) Appl. No.: 09/871,699

(22) Filed: Jun. 4, 2001

(65) Prior Publication Data

US 2002/0001192 A1 Jan. 3, 2002

(30) Foreign Application Priority Data

Jun. 2, 2000 (JP) ........................................ 2000-165864

(51) Int. Cl.[7] ................................................. F21L 4/00
(52) U.S. Cl. ....................... 362/187; 362/800; 362/119; 362/120; 362/202; 362/203
(58) Field of Search ................................. 362/800, 119, 362/202, 203, 187, 545, 247, 231; 313/500, 505, 510, 498, 512; 257/100, 86, 91, 93, 98, 99

(56) References Cited

U.S. PATENT DOCUMENTS

| | | | | |
|---|---|---|---|---|
| 5,177,593 A | * | 1/1993 | Abe | 257/98 |
| 5,475,241 A | * | 12/1995 | Harrah et al. | 257/99 |
| 6,093,940 A | * | 7/2000 | Ishinaga et al. | 257/99 |
| 6,345,903 B1 | * | 2/2002 | Koike et al. | 362/249 |
| 6,383,835 B1 | * | 5/2002 | Hata et al. | 438/65 |

* cited by examiner

Primary Examiner—Stephen Husar
Assistant Examiner—Anabel Ton
(74) Attorney, Agent, or Firm—McGinn & Gibb, PLLC

(57) ABSTRACT

Separate leads and a common lead are provided on the upper and lower surfaces of a substrate. A plurality of LED elements are disposed in an array on the common lead on the upper surface of the substrate. The common lead provided on the upper surface of the substrate is connected to the common lead provided on the lower surface of the substrate through through-hole plating. Heat generated from the plurality of LED elements is transferred through the common lead provided on the upper surface of the substrate and the through-hole plating to the common lead provided on the lower surface of the substrate and is release therefrom into the air. By virtue of this construction, an light emitting device can be realized in which heat radiating properties are homogenized, heat radiation efficiency is improved, and a compact structure is obtained and, thus, the color balance is improved and unfavorable phenomena such as lowering in the output of light emitting elements and shortening of the service life are avoided.

31 Claims, 6 Drawing Sheets

LIGHT EMITTING DEVICE

This invention is based on Japanese application 2000-165864 filed Jun. 2, 2000, which is hereby incorporated by reference.

BACKGROUND OF THE INVENTION

1. Field of the Invention

The present invention relates to a light emitting device, and more particularly to a light emitting device suitable for use, for example, as white light sources for backlight or frontlight in liquid crystal display panels.

2. Description of Related Art

Various light emitting devices for backlight in full color liquid crystal display panels are known. Generally, a light emitting device (LED) includes an LED chip array comprising an LED for red (R), an LED for green (G), and an LED for blue (B). A light guide section is generally provided such that light from the LED chip array enters therein through an incident face. The light is guided so as to propagate through the inside of the light guide section, thereby permitting planar backlight to be emitted through an outgoing face from the light guide section. Each of the LEDs for respective colors R, G, and B has a narrow-band emission spectrum. Therefore, upon light emission from each LED for R, G, and B, lights of R, G, and B from the respective LEDs can be mixed together to supply white backlight to a liquid crystal display panel. One such example is shown in Japanese Patent Laid-Open No. 329044/1999.

Radiation characteristics of each light emitting device varies from position to position and the speed of deterioration varies for each light emitting element. This tends to change the color balance over time. Light emitting elements having poor radiation characteristics can generally cause lowered power output and have shortened service life, which is undesirable.

Some light emitting elements, such as G and B, have both positive and negative electrodes on light emitting faces thereof, which can increase the number of bonding elements coupled to the light emitting elements. With more bonding elements coupled to the light emitting elements, a compact packaging arrangement is difficult to achieve.

SUMMARY OF THE INVENTION

Accordingly, it is an aspect of embodiments of the invention to provide a light emitting device in which homogeneous radiation characteristics can be obtained and, thus, no significant change balance in color results from the elapse of time.

It is another aspect of embodiments of the invention to provide a light emitting device in which improved radiation efficiency is obtained and unfavorable phenomena such as lowering in power output and shortening of service life of light emitting elements can be avoided.

It is a further aspect of embodiments of the invention to provide a light emitting device having a compact structure.

According to a first feature of the invention, a light emitting device includes an insulating base having positive and negative leads, respectively, provided on top and bottom surfaces thereof. A LED chip array is arranged on the negative lead on the top surface of the insulating base. The LED chip array is electrically connected to the positive and negative leads on the top surface of the insulating base. A first metal connection connects the positive leads on the top and bottom surfaces of the insulating base; and a second metal connection connects the negative leads on the top and bottom surfaces of the insulating base.

According to a second feature of the invention, a light emitting device includes a pair of metal layers provided respectively on the upper and lower surfaces of an insulating base. A plurality of light emitting elements are arranged on the metal layer provided on the upper surface of the insulating base, and a metal connection connects the pair of metal layers to each other at a position where at least one of the of the plurality of light emitting elements is disposed.

According to this construction, heat generated from the plurality of light emitting elements is released through the metal layer provided on the upper surface of the insulating base into the air, and, in addition, is transferred through the metal connection to the metal layer provided on the lower surface of the insulating base and is then released into the air. Further, since the radiating surface is increased, the radiation efficiency can be improved.

According to a third feature of the invention, a light emitting device includes a substrate comprising a plurality of leads provided on an insulating base. A plurality of light emitting elements are arranged on a base line along the surface of the substrate in its predetermined direction. A plurality of bonding wires connect the plurality of light emitting elements to the plurality of leads in the predetermined direction or on one side relative to the base line.

According to this construction, in the connection of the plurality of light emitting elements to the plurality of leads through bonding wires, this connection is carried out in such a state that the bonding wire has been rendered eccentric. This can reduce the size of the device in a direction perpendicular to a direction in which the plurality of light emitting elements are arrayed. The plurality of light emitting elements comprise a first light emitting element having first and second electrodes on its light emitting face side and a second light emitting element having a first electrode on its light emitting face side and a second electrode on its side remote from the light emitting face. The term "light emitting element" as used herein means a bared chip, such as LED (light emitting diode) having first and second electrodes. The term "substrate" refers to, for example, a printed board formed by providing leads connected to first and second electrodes on a base by a circuit printing method, and a substrate having a lead frame structure formed by placing a lead frame, corresponding to leads connected to first and second electrodes, within a mold and pouring an insulating material into the mold.

According to a fourth feature of the invention, a light emitting device includes a pair of metal layers provided respectively on the upper surface and lower surface of an insulating base. A plurality of light emitting elements are arranged on a base line along the surface of the metal layer, in its predetermined direction, provided on the upper surface of the insulating base. A metal connection connects the pair of metal layers to each other at a position where a predetermined light emitting element out of the plurality of light emitting elements is disposed. A plurality of bonding wires connect the plurality of light emitting elements to the metal layer, provided on the upper surface of the insulating base, in the predetermined direction or on one side relative to the base line.

According to this construction, heat generated from the plurality of light emitting elements is released through the pair of metal layers provided respectively on the upper and lower surfaces of the insulating base into the air. In addition, in the connection of the plurality of light emitting elements to the plurality of leads through bonding wires, this connection is carried out in such a state that the bonding wire has been rendered eccentric. This can reduce the size of the device in a direction perpendicular to a direction in which the plurality of light emitting elements are arrayed.

According to a fifth feature of the invention, a light emitting device for driving a plurality of LED chips disposed in an array to emit a mixed light composed of lights emitted from the plurality of LED chips, an insulating base having an upper surface and a lower surface. An LED chip connection lead is provided on the upper surface of the insulating base. A power supply connection lead is provided on the lower surface of the insulating base. A link lead connects the LED chip connection lead to the power supply connection lead between the upper and lower surfaces of the insulating base. The LED chip connection lead comprises a plurality of separate leads connected respectively to the plurality of LED chips and a common lead, to which the plurality of LED chips are connected by common connection and which is loaded with the plurality of LED chips, for absorbing heat generated from the plurality of LED chips.

According to this construction, heat generated from the plurality of LED chips is released, through a common lead in the LED chip connection lead provided on the upper surface of the insulating base, into the air, and, in addition, is transferred through the link lead, to the power supply connection lead provided on the lower surface of the insulating base, and is then released into the air. Further, since the radiating surface is increased, the radiation efficiency can be improved.

These and other aspects and features of this invention will be described in or apparent from the following detailed description when taken in conjunction with the accompanying drawings, which are a part of this disclosure and which illustrate, by way of example, preferred embodiments of the invention.

BRIEF DESCRIPTION OF THE DRAWINGS

The invention will be explained in more detail in conjunction with the appended drawings, wherein.

DESCRIPTION OF PREFERRED EMBODIMENTS

Figure 1A:
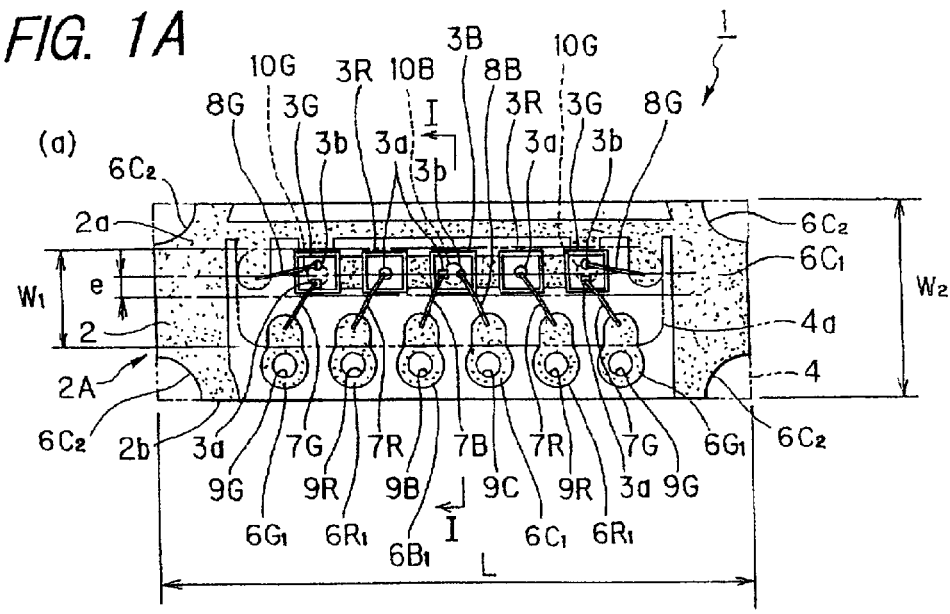
FIG. 1A is a diagram showing the upper surface of the light emitting device in a first preferred embodiment of the invention.
Figure 1B:
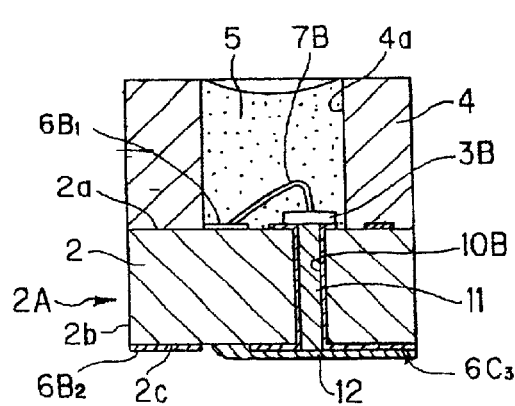
FIG. 1B is a cross-sectional view taken on line I—I of FIG. 1A.
Figure 1C:
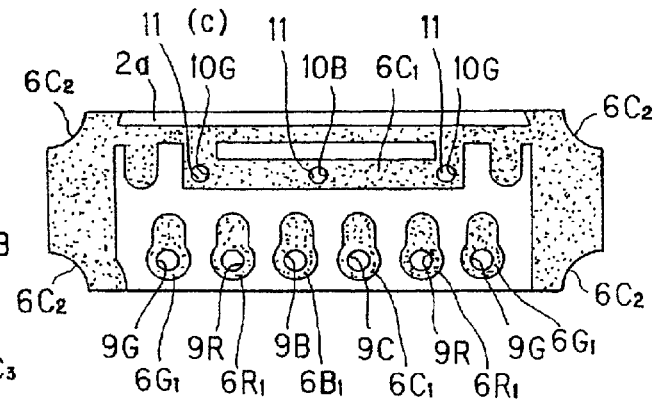
FIG. 1C is a diagram showing a metal pattern provided on the upper surface of the light emitting device.
Figure 1D:
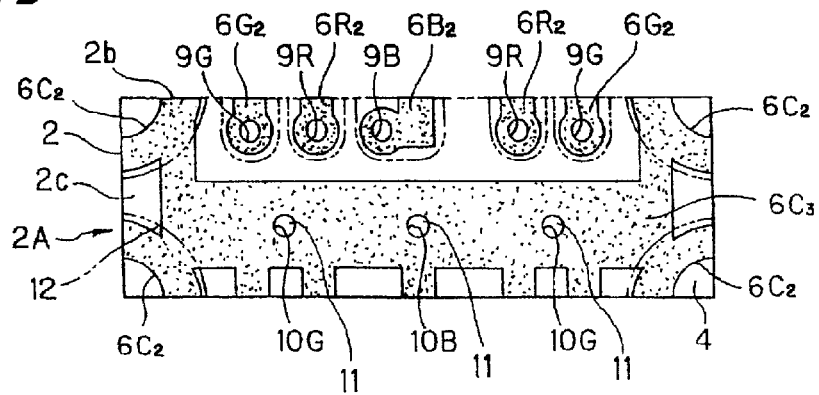
FIG. 1D is a diagram showing the lower surface of the light emitting device.

FIGS. 1A, 1B, 1C and 1D show a light emitting diode or device (LED) in accordance with the principles of the present invention. For the facilitation of understanding, in FIG. 1A, a case and a filling member are not shown, and, in FIG. 1C, a resin is not shown. The light emitting device 1 comprises a printed circuit board 2A on which a metal pattern to be loaded with LED has been printed. A plurality of LEDs 3 (3R (red), 3G (green), 3B (blue)) are disposed in an array. The LED array 3 is electrically connected to the positive and negative leads on the upper surface 2a of the printed circuit board 2A. A case 4 having an opening 4a provided so as to surround the plurality of LEDs 3. A filling member 5, for example, of a transparent epoxy resin, fins the opening 4a and seals the plurality of LEDs 3 in the case 4.

The printed circuit board 2A includes a base 2 having upper, lower and side surfaces 2a, 2c, 2b, respectively. Preferably, the printed circuit board 2A can be produced in a small size at low cost so that an inexpensive and small-size light emitting device can be achieved.

The base 2 is formed of a material having heat resistance and high white reflectance, for example, a glass-epoxy resin containing a white colorant having high white reflectance. The printed circuit board 2A also has a metal pattern comprising separate leads 6R, 6G, 6B respectively for red (R), green (G) and blue (B) light elements 3R, 3G and 3B, respectively, printed on the upper surface 2a of the base 2. The printed circuit board 2A also has a common lead 6C common to each light element 3R, 3G, 3B included in the plurality of LEDs 3. A resist 12 (FIG. 1B) is applied to the lower surface 2c of the base 2 and is configured to help prevent short circuiting among leads 6R, 6G, 6B, 6C.

The separate leads 6R, 6G, 6B comprise electrode faces $6R_1$, $6G_1$, $6B_1$ provided on the upper surface 2a of the base 2 and connections $6R_2$, $6G_2$, $6B_2$ provided on the lower surface 2c of the base 2. The common lead 6C comprises an electrode face $6C_1$ provided on the upper surface 2a of the base 2, a connection $6C_2$ provided on the side face 2b of the base 2 and a heat radiating section $6C_3$ provided on the lower surface 2c of the base 2. The electrode face $6C_1$ in the common lead 6C has a substantially ⊃ shape, but could be configured to have other shapes as well, for example, any arcuate configuration.

The electrode faces $6R_1$, $6G_1$, $6B_1$ of the separate leads 6R, 6G, 6B provided on the upper surface 2a of the base 2 are connected to the connections $6R_2$, $6G_2$, $6B_2$, which are provided on the lower surface 2c of the base 2. Through-hole platings 9R, 9G, 9B and a solder 11 filled into the through-hole platings 9R, 9G, 9B connect the electrode faces $6R_1$, $6G_1$, $6B_1$ to the connections $6R_2$, $6G_2$, $6B_2$. The electrode face $6C_1$ in the common lead 6C provided on the upper surface 2a of the base 2 is connected to the heat radiating section $6C_3$ provided on the lower surface 2c of the base 2 via through-hole platings 10R, 10G, 10B. Solder 11 is filled into the through-hole platings 10R, 10G, 10B, and the connection $6C_2$. The through-hole platings 10R, 10G, 10B are provided adjacent to and below the LEDs 3G, 3B. The LEDs 3G, 3B can generate a large quantity of heat, among the plurality of LEDs 3.

Figure 2A:
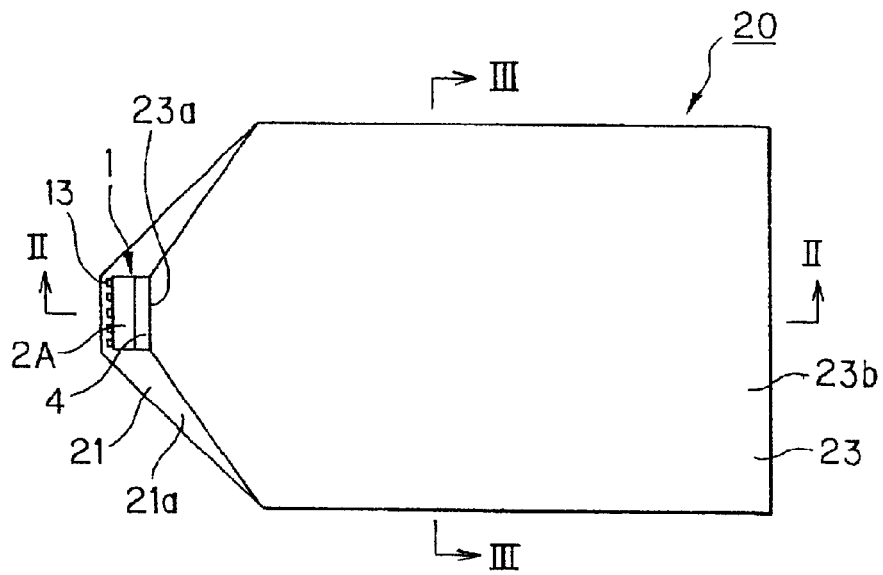
FIG. 2A is a plan view showing an embodiment of the application of the light emitting device according to the first preferred embodiment of the invention to a backlight apparatus.
Figure 2B:
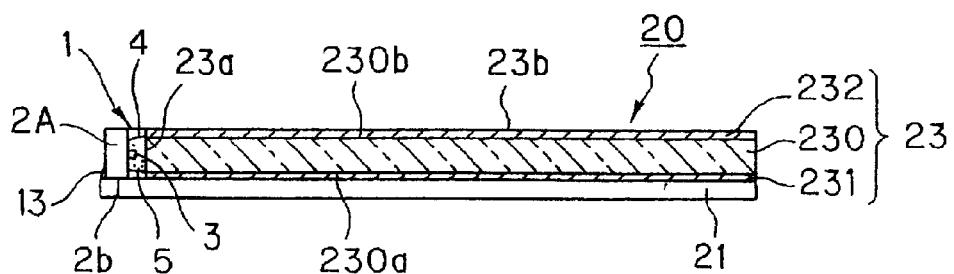
FIG. 2B is a cross-sectional view taken on line II—II of FIG. 2A.
Figure 2C:
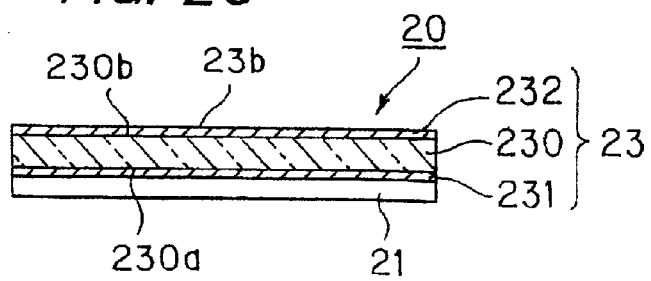
FIG. 2C is a cross-sectional view taken on line III—III of FIG. 2A.

The side face 2b of the base 2 functions as a face for mounting to a light emitting device mount substrate, as will be described in greater detail below. The connections $6R_2$, $6G_2$, $6B_2$, $6C_2$ are connected to a wiring pattern provided on the light emitting device mount substrate 21 (FIGS. 2A, 2B and 2C).

The plurality of LEDs 3 comprise a blue light emitting element 3B disposed in the center of the array of LEDs, two red light emitting elements 3R disposed adjacent and on opposite sides of the blue light emitting element 3B and two green light emitting elements 3G disposed adjacent to and on opposite sides of the blue light emitting elements 3B. The red light emitting element or LED 3R is formed of, for example, an AlInGaP-base semiconductor which emits red light. The red LED 3R has a first electrode 3a on its upper surface $6R_1$ and a second electrode 3b on its lower surface. The first electrode 3a on the upper surface 2a is electrically connected to the electrode face $6R_1$ of the separate lead 6R for R, for example, using a bonding wire 7R. The second electrode 3b on the lower surface 2c is electrically and mechanically connected to the electrode face $6C_1$ of the common lead 6C and may be bonded thereto, for example, using a conductive adhesive. The green LED 3G comprises, for example, a GaN-base semiconductor which emits a green light. The green LED 3G has a first electrode 3a and a second electrode 3b on its upper surface. The lower surface is mechanically connected to the electrode face $6C_1$ of the common lead 6C with the aid of an adhesive.

As best shown in FIG. 1A, the first electrode 3a is electrically connected to the electrode face $6G_1$ for G through the bonding wire 7G. The second electrode 3b is electrically connected to the common electrode face $6C_1$ through a bonding wire 8G. The blue LED 3B comprises, for example, a GaN-base semiconductor which emits blue light. The blue LED 3B has a first electrode 3a and a second electrode 3b on its upper surface. The lower surface is mechanically connected to the electrode face $6C_1$ of the common lead 6C with the aid of an adhesive. The first electrode 3a is electrically connected to the electrode face $6B_1$ for B through a bonding wire 7B. The second electrode 3b is electrically connected to the common electrode face $6C_1$ through a bonding wire 8B. The LEDs 3R, 3G, 3B respectively for colors R, G, and B have a light intensity ratio of, for example, 1:3:1. Therefore, when numbers corresponding to light intensity ratio of the blue LED 3B, the red LED 3R, and the green LED 3G are used, as described above (one, two, and two, respectively), for example, an optimal intensity ratio of lights R, G, and B for providing white light through mixing of lights R, G, and B (for example, R:G:B=2:6:1) can be realized.

The insulating base 2 and the case 4 are formed of a material having high white reflectance, thus a high level of reflection can be realized for all emission wavelengths of R, G, and B. Since all emission wavelengths of R, G and B can be enhanced, the power used can be reduced. The case 4 may be formed of, for example, a white resin, such as polyphthalamide with a white colorant having high white reflectance incorporated therein or may be formed of a resin wherein a white coating is applied onto the opening 4a.

The printed circuit board 2A can be loaded with the LED 3 and may be mounted onto the light emitting device mount substrate 21, followed by mounting onto the printed circuit board 2A, as shown in FIG. 2A. The case 4 can be mounted on the board 2A, such that the draft angle of the opening 4a can be reduced. The opening 4a defined by the case 4 can be any configuration although shown as a generally annular opening in FIG. 1A.

As best seen in FIG. 1A, the opening 4a is provided so that the center of the plurality of LEDs 3 is spaced from the center of the opening 4a by a distance "e". In the illustrated embodiment, the distance "e" is shown in a direction perpendicular to the horizontally aligned array of LEDs 3, but the distance "e" could also be formed in a direction along the LEDs shown in FIGS. 1A, 1C and 1D.

In the light emitting device 1, heat from the LEDs 3G, 3B, which generate a relatively large quantity of heat, is released through the common lead 6C into the air. The heat is also transferred through the through-hole platings 10R, 10G, 10B and the solder 11 before being released into the air through the common lead 6C provided on the lower surface 2c of the insulated base 2. This allows radiation characteristics among the LEDs 3R, 3G, 3B to be homogenized, and, thus, a change in color balance over time is reduced. Further, unfavorable phenomena, such as lowered power output and shortened service life, caused by a temperature rise of the LED 3 can be avoided. Since the radiating surface is increased, the radiation efficiency can be improved, which makes it possible to avoid the unfavorable phenomena, such as lowered power output and shortened service life of the LED 3.

As best seen in FIG. 1A, bonding wires 7R, 7G, 7B, 8R, 8G, 8B extend toward the array of LEDs 3 and are extended from this array toward one side thereof. The plurality of LEDs 3 can be disposed in an eccentric state relative to the opening 4a. This reduces the width $W_1$ of the opening 4a, and can realize a compact structure such that the width $W_2$ of the device 1 has been reduced.

In mixing lights R, G, and B to form white light, light can be emitted from the blue LED 3B at full power. Therefore, light can be efficiently emitted. Further, since the base 2 and the case 4 are formed of a material having high white reflectance, a high level of reflection can be realized for all emission wavelengths of R, G, and B. Therefore, the emission efficiency can be enhanced, and the power can be reduced. Additionally, the printed board 2A used is one which can be produced in a small size at low cost. This can provide an inexpensive and small-size light emitting device.

In FIG. 1A, LEDs 3G, 3R, 3B, 3R and 3G for colors G, R, B, R and G are arranged to be arrayed in the horizontal direction. The arrangement of LEDs may be changed as LEDs arranged respectively for colors R, G, B, G and R in the horizontal direction. Even in this arrangement, the same advantage as the first preferred embodiment is obtained. On the other hand, the arrangement of LEDs for colors R, B, G, B and R to be arrayed may be adopted, when bluish white light is required to be emitted from the arrangement of LEDs.

FIGS. 2A to 2C show a backlight apparatus 20 including the light emitting device 1. The backlight apparatus 20 comprises a light emitting device mount substrate 21, the light emitting device 1 and a light guide section 23. The light emitting device mount substrate 21 includes an LED drive circuit (FIG. 3) having a wiring pattern on its surface 21a. The light emitting device 1 is provided on one end of the light emitting device mount substrate 21 and has leads 6R, 6G, 6B, 6C connected to a wiring pattern on the light emitting device mount substrate 21. Light from the light emitting device 1 enters the light guide section 23 through an incident face 23a thereof and is guided so as to propagate through the inside of the light guide section 23, thereby permitting planar white backlight to be exit from the light guide section 23 through an outgoing face 23b.

The light guide section 23 comprises a light guide plate 230 formed of a transparent material, such as polycarbonate, acryl, or glass, a reflection plate 231 which is provided on the backside 230a of the light guide plate 230 and a diffusion plate 232. The reflection plate 231 is formed of a white film of polyethylene terephthalate or the like and is configured to reflect light incident to the incident face 23a from the light emitting device 1. The diffusion plate 232 is provided on the surface 230b of the light guide plate 230 and is formed of, for example, a polycarbonate film having concave and convex portions in the outgoing face 23b. The diffusion plate 232 is configured to diffuse light which is incident from the light emitting device 1 to the incident face 23a and to diffuse light which is reflected from the reflection plate 231.

Figure 3:
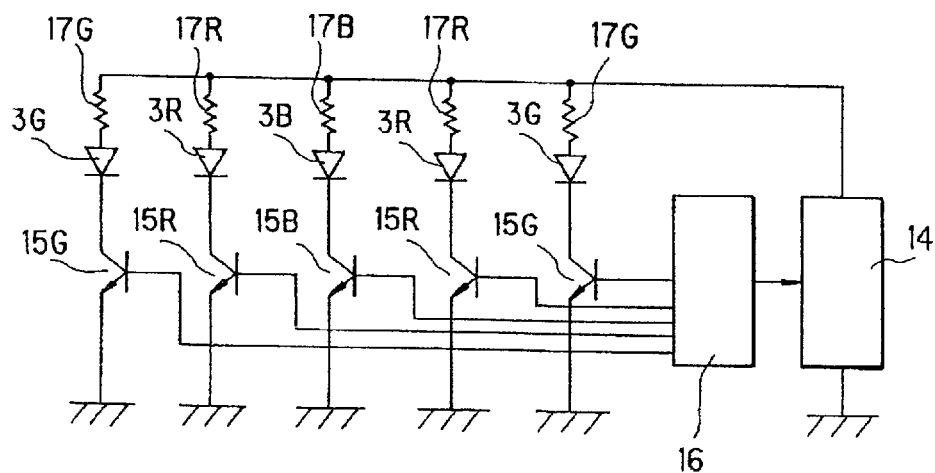
FIG. 3 is a diagram showing an LED drive circuit in the light emitting device according to the first preferred embodiment of the invention.

FIG. 3 shows the LED drive circuit provided on a light emitting device mount substrate 21. As illustrated, the LED drive circuit comprises a power supply 14 and a control unit 16. The power supply 14 is configured to apply a drive voltage to the anode or positive lead of each of LEDs 3R, 3G, 3B while the control unit 16 is connected to the cathode or negative lead of each of LEDs 3R, 3G, 3B. The control unit 16 connects to the LEDs 3R, 3G, 3B through transistors 15R, 15G, 15B and control resistors 17R, 17G, 17B so as to control the light emission from the LEDs 3R, 3G, 3B. The control unit 16 also controls the power supply 14. In the illustrated LED drive circuit, the LEDs 3R, 3G, 3B can simultaneously emit light and white backlight can be output Light of any color can be emitted from the LEDs 3R, 3G, 3B by separately emitting light from the LEDs 3R, 3G, 3B, or by varying the luminous intensity from the LEDs 3R, 3G, 3B for the desired color.

Figure 4:
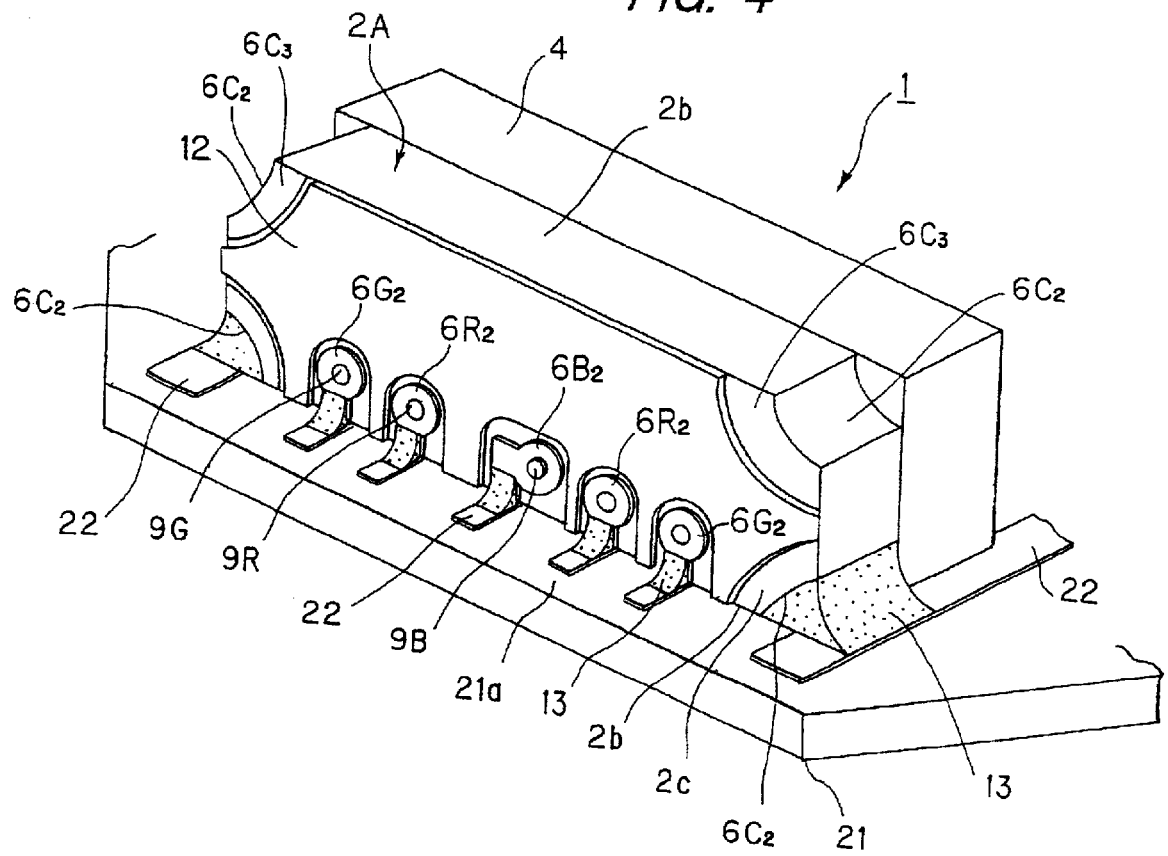
FIG. 4 is a perspective view of the principal part of an assembly comprising the light emitting device according to the first preferred embodiment of the invention incorporated into a backlight apparatus.

FIG. 4 shows an assembly comprising the light emitting device 1 and the backlight apparatus 20. In incorporating the light emitting device 1 and the backlight apparatus 20 into the illustrated assembly, the light emitting device 1 is first mounted on the light emitting device mount substrate 21. A wiring pattern 22, provided on the surface 21a of the light emitting device mount substrate 21, connects to the connections $6R_2$, $6G_2$, $6B_2$, $6C_2$ of the light emitting device 1, for example, by using a solder 13. Next, an adhesive or epoxy can bond the case 4 to the upper surface 2a of the printed circuit board 2A, for example, and thereafter the filling member 5 fills the inside of the opening 4a and hermetically seals the LEDs 3R, 3G, 3B in the case 4. The light guide section 23 of the backlight apparatus 20 is mounted onto the light emitting device mount substrate 21.

Alternatively, in an embodiment not shown, the light emitting device 1 could directly mount onto the light emitting device mount substrate 21 to easily mount the light emitting device 1 onto the light emitting device mount substrate 21. In this configuration, the case 4 and the filling 5 could be omitted from the assembly.

When the light emitting device 1 is mounted onto the light emitting device mount substrate 21, connection is performed through the solder 13 in the connections $6R_2$, $6G_2$, $6B_2$. The connections $6R_2$, $6G_2$, $6B_2$ are provided on the lower surface 2c of the substrate 2A while the connection $6C_2$ is provided on the side face 2b. This configuration can prevent the board 2A from being toppled backward, for example.

As best seen in FIGS. 2A, 2B and 2C, the backlight apparatus 20 is configured such that the LEDs 3 for respective colors are densely disposed to create a state close to a point light source. Therefore, white light can be homogeneously diffused within the light guide plate 230. As a result, a diffusion homogeneity of not less than 60% in terms of minimum brightness relative to the maximum brightness can be ensured in the outgoing face 23b of the light guide section 23. This diffusion homogeneity can prevent color shading in full color liquid crystal display panels, for example.

The thickness of the backlight apparatus 20 can be reduced by reducing the width $W_1$ of the opening 4a in the light emitting device 1.

Other embodiments of the light emitting device 1 and the backlight apparatus 20 will be described below. In the descriptions of the further embodiments, only the points of difference of each embodiment from the first embodiment will be described. That is, in those embodiments, the constituent parts the same as those in the first embodiment are referenced correspondingly in the drawings and the description about them will be omitted.

Figure 5:
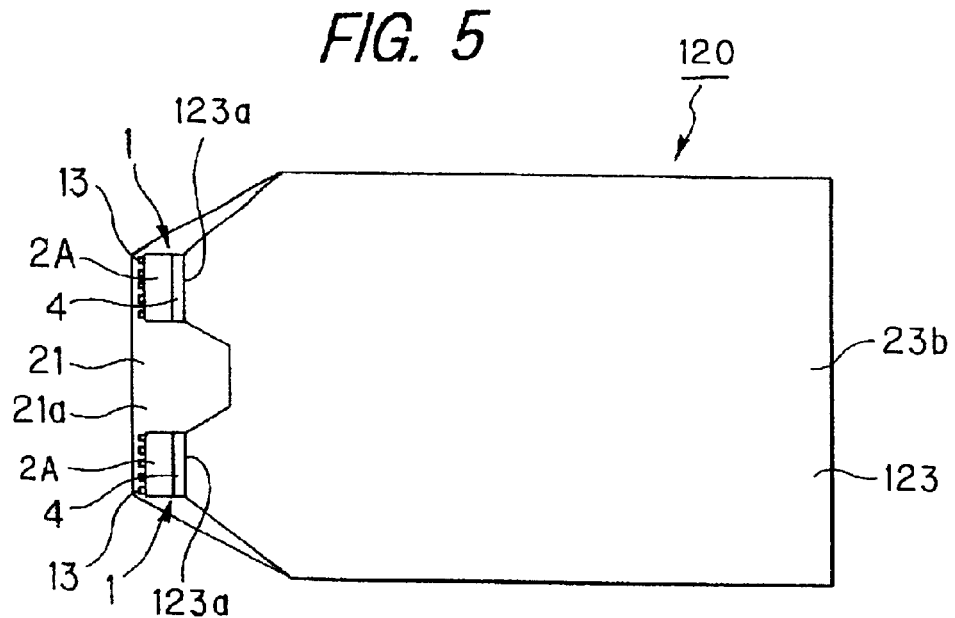
FIG. 5 is a plan view showing an embodiment of the application of the light emitting device according to the first preferred embodiment of the invention to a backlight apparatus.

FIG. 5 shows a backlight apparatus 120, which is an alternative embodiment of the backlight apparatus 20 shown in FIG. 2. The backlight apparatus 120 includes two incident faces 123a of the light guide section 123 provided on one side thereof. One light emitting device 1 is provided on each incident face 123a. By providing two incident faces 123a, more homogeneous emission characteristics can be realized in the widthwise direction for the backlight apparatus 120.

Figure 6:
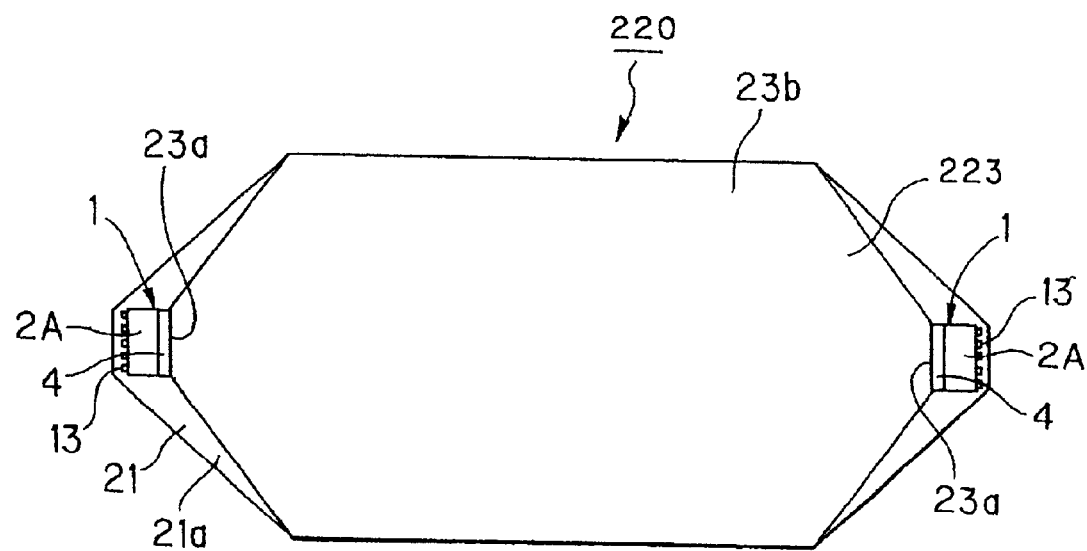
FIG. 6 is a plan view showing an embodiment of the application of the light emitting device according to the first preferred embodiment of the invention to a backlight apparatus.

FIG. 6 shows backlight apparatus 220, which is another alternative embodiment of the backlight apparatus 20 shown in FIG. 2. The backlight apparatus 220 includes the two diametrically opposed incident faces 23a. The incident faces 23a are provided on both sides of the light guide section 23 and each include one light emitting device 1 provided thereon. By providing two incident faces 123a on opposite sides of the backlight apparatus 220, more homogeneous emission characteristics can be realized in the longitudinal direction for the backlight apparatus 220.

Figure 7A:
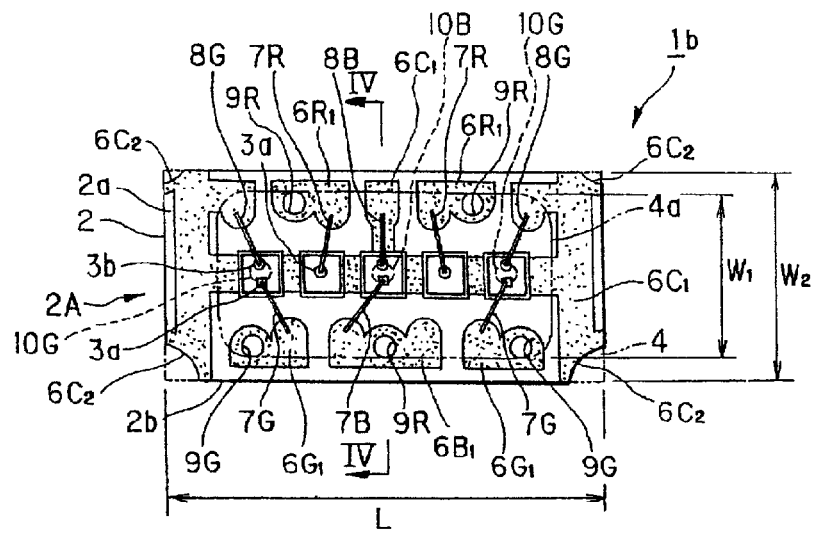
FIG. 7A is a diagram showing the upper surface of the light emitting device showing a light emitting device according to a second preferred embodiment of the invention.
Figure 7B:
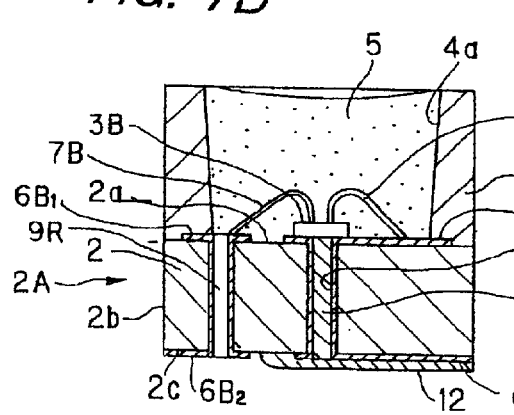
FIG. 7B is a cross-sectional view taken on line IV—IV of FIG. 7A.
Figure 7C:
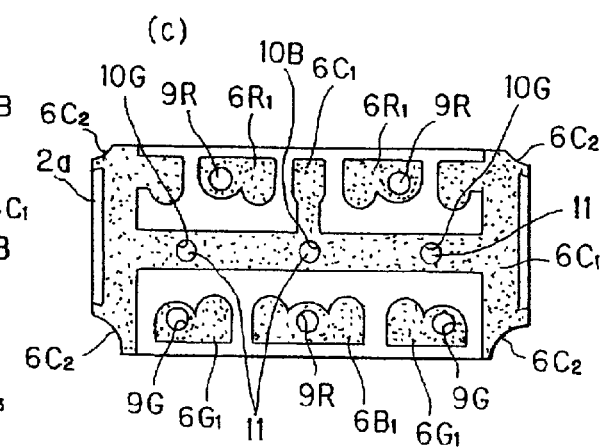
FIG. 7C is a diagram showing a metal pattern provided on the upper surface of the light emitting device.
Figure 7D:
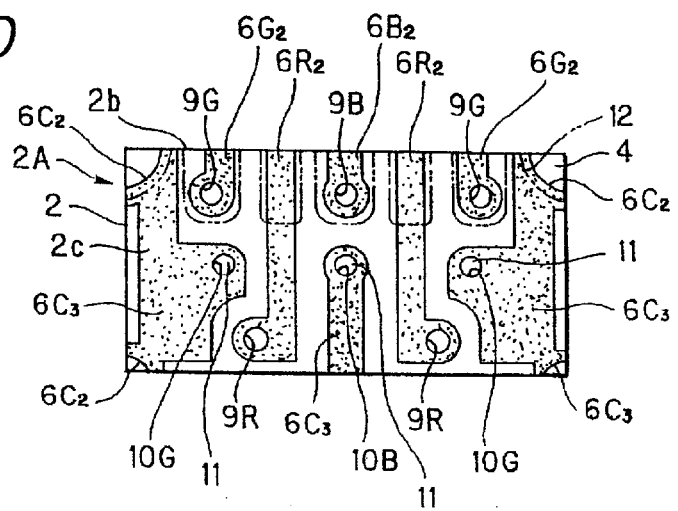
FIG. 7D is a diagram showing the lower surface of the light emitting device.
Figure 8A:
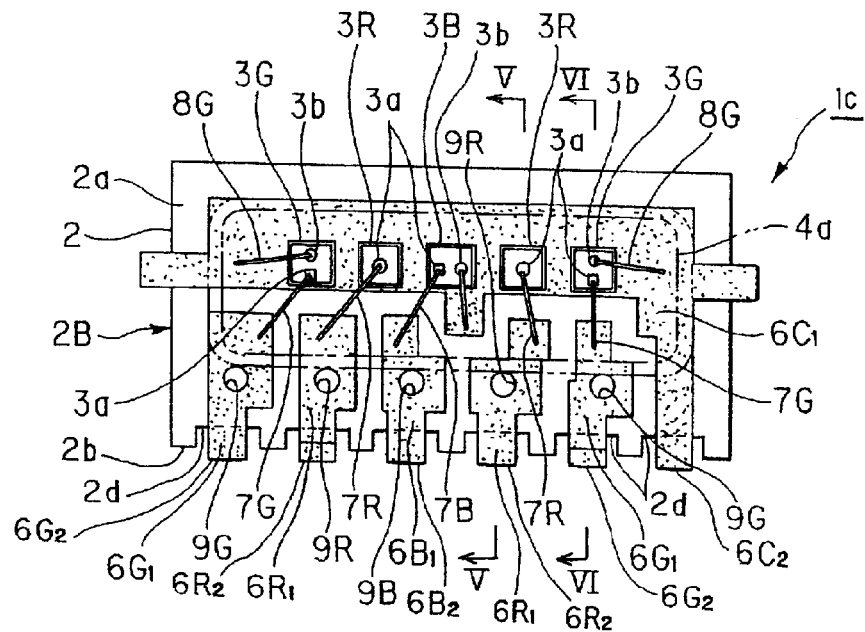
FIG. 8A is a diagram showing the upper surface of a light emitting device according to a third preferred embodiment of the invention.
Figure 8B:
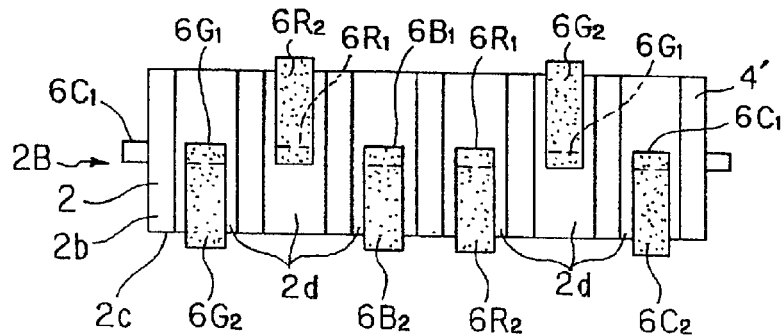
FIG. 8B is a front view.
Figure 8C:
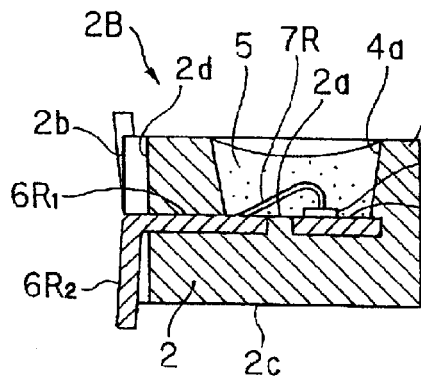
FIG. 8C a cross-sectional view taken on line V—V of FIG. 8A.
Figure 8D:
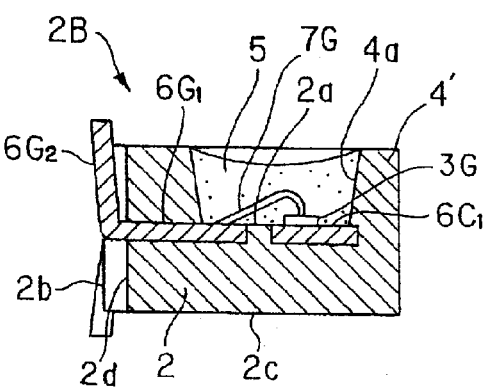
FIG. 8D is a cross-sectional view taken on line VI—VI of FIG. 8A.

In FIGS. 7A to 7D, a light emitting device 1b is shown. Light emitting device 1b is an alternative embodiment of the light emitting device 1. The light emitting device 1b has the same construction as the light emitting device 1, except that the LEDs 3R, 3G, 3B are disposed at the center of the opening 4a in the case 4, rather than being spaced a distance "e" therefrom. Also, as shown in FIG. 7A, the bonding wires 7R, 7G, 7B and 8R, 8G, 8B, respectively, are vertically spaced from one another. Since the bonding wires 7R, 7G, 7B, 8R, 8G, 8B are vertically spaced from one another, the pitch of the LEDs 3R, 3G, 3B in the longitudinal direction can be reduced. Thus, the size in the direction of length L can be reduced. Additionally, the electrode face $6C_1$ of the common lead 6C according to the second preferred embodiment has a substantially H shape.

In FIGS. 8A to 8D, a light emitting device 1c is shown. The light emitting device 1c has the same construction as the light emitting device 1, except that a substrate 2B having a lead frame structure is used instead of the printed circuit board 2A and a case 4', corresponding to the case 4, is formed of the same material as the base 2.

The substrate 2B comprises a substrate 2 formed of a material having heat resistance and high white reflectance.

Separate leads 6R, 6G, 6B for respective colors R, G, and B are incorporated into the base 2 when the base 2 is molded. A common lead 6C is common to the plurality of LEDs 3. The leads 6R, 6G, 6B, 6C comprise electrode faces $6R_1$, $6G_1$, $6B_1$, $6C_1$, provided on the upper surface 2a of the base 2, and connections $6R_2$, $6G_2$, $6B_2$, $6C_2$ provided on the side face 2b of the base 2. The connection $6R_2$ for R and the connection $6G_2$ for G are extended toward the case 4'. A concave surface 2d for receiving the connections $6R_2$, $6G_2$, $6B_2$, $6C_2$ is provided in the base 2. Leads 6R, 6G, 6B, 6C may be formed by placing a lead frame within a mold, pouring a material for the base 2 into the mold to mold the substrate 2B provided with the case 4', cutting the lead frame into a predetermined shape, and then bending the lead frame, The light emitting devices 1b or 1c can be incorporated into any one of the backlight apparatuses 20, 120, 220. For example, when incorporating the light emitting device 1c into the backlight apparatus 20, the connections $6R_2$, $6G_2$, $6B_2$, $6C_2$ and the filling member 5 are connected to the wiring pattern provided on the light emitting device mount substrate 21 through a solder. This effectively mounts the light emitting device 1 on the light emitting device mount substrate 21.

When the light emitting device 1 is incorporated into the backlight apparatus 20, the post-mounting work of the case 4 after mounting the light emitting device 1 onto the light emitting device mount substrate 21 can be eliminated. Therefore, the light emitting device 1 can be easily mounted onto the light emitting device mount substrate 21.

Further, since the leads 6R, 6G, 6B, 6C in the substrate 2B having a lead frame structure, they each can function as a heat sink. Therefore, a highly heat-resistant package can be produced.

Light emitting elements, all of which emit an identical color light, may be used as the light emitting elements mounted on the substrate. Regarding the through-hole plating provided just under light emitting elements which generate a large quantity of heat, one or a plurality of through-hole platings may be provided around the light emitting elements which generate a large quantity of heat.

As is apparent from the foregoing description, according to the light emitting device of the invention, heat generated from a plurality of light emitting elements are released through a metal layer and metal connections into the air. By virtue of this, when a plurality of light emitting elements are used, radiation characteristics can be homogenized, and, thus, a change in color balance with the elapse of time can be reduced.

Further, since the radiation surface is increased, the radiation efficiency can be improved, and thus, unfavorable phenomena of light emitting elements, such as lowered power output and shortened service life, can be avoided.

Furthermore, in connecting a plurality of light emitting elements to a plurality of leads, this connection is carried out in such a state that the bonding wire has been rendered eccentric. This can reduce the size of the device in a direction perpendicular to a direction in which the plurality of light emitting elements are arrayed.

The invention has been described in detail with particular reference to preferred embodiments, but it will be understood that variations and modifications can be effected within the scope of the invention as set forth in the appended claims.

Since numerous modifications and changes to the embodiments described above will readily occur to those of ordinary skill in the art, it is not desired to limit the invention to the exact construction and operation illustrated and described. Accordingly, all suitable modifications and equivalents should be considered as falling within the spirit and scope of the invention.

What is claimed is:

1. A light emitting device comprising:
an insulating base having a plurality of electrical leads including positive and negative leads provided on top and bottom surfaces thereof, including a negative lead on said top surface and a negative lead on said bottom surface, each said negative lead comprising a common metal layer;
an LED chip array arranged on said negative lead on said top surface of said insulating base, said LED chip array being electrically connected to said positive and negative leads on said top surface of said insulating base;
a plurality of first metal connections configured to respectively interconnect said positive leads on said top and bottom surfaces of said insulating base; and
at least one second metal connection configured to interconnect said negative leads on said top and bottom surfaces of said insulating base, wherein for each said at least one second metal connection, one LED chip of said LED chip array is mounted directly thereon.

2. The light emitting device according to claim 1, wherein:
said LED chip array comprises blue, green, and red LED chips,
the positive leads include blue, green, and red positive leads arranged at one side of said LED chip array,
the negative leads include a first common lead arranged at another side of said LED chip array and a second common lead arranged at said one side of said LED chip array,
said blue LED chip being connected to said blue positive lead and said second common lead by bonding wires,
said green LED chip being connected to said green positive lead and said first common lead by bonding wires, and
said red LED chip being connected to said red positive lead by a bonding wire and to said first common lead by a direct contact with a bottom electrode thereof.

3. The light emitting device according to claim 1, wherein:
said LED chip array comprises blue, green and red LED chips having one arrangement selected from a first arrangement, a second arrangement and a third arrangement,
said first arrangement including a green LED chip, a red LED chip, a blue LED chip, a red LED chip and a green LED chip arranged in order in a predetermined direction,
said second arrangement including a red LED chip, a green LED chip, a blue LED chip, a green LED chip and a red LED chip arranged in order in said predetermined direction, and
said third arrangement including a red LED chip, a blue LED chip, a green LED chip, a blue LED chip and a red LED chip arranged in order in said predetermined direction.

4. A light emitting device comprising:
an insulating base having an upper surface and a lower surface;
a metal layer provided on the upper surface and the lower surface of the insulating base;

a plurality of light emitting elements arranged on the metal layer provided on the upper surface of the insulating base; and a metal connection that connects the metal layers to each other at a position substantially directly beneath a location where at least one of the plurality of light emitting elements is disposed.

5. The light emitting device according to claim 4, wherein the metal connection comprises a through-hole plating.

6. The light emitting device according to claim 5, wherein the through-hole plating has a hollow portion filled with metal.

7. The light emitting device according to claim 4, wherein:

the plurality of light emitting elements comprises a first light emitting element configured to emit light at a predetermined heat amount and a second light emitting element configured to emit light at a lower heat amount than the predetermined heat amount, and the metal connection connects the metal layers to each other at a position where the first light emitting element has been disposed.

8. The light emitting device according to claim 4, wherein:

the plurality of light emitting elements comprises one blue light emitting element, one or more green light emitting elements, and two or more red light emitting elements.

9. The light emitting device according to claim 4, wherein:

the plurality of light emitting elements comprises one blue light emitting element, two green light emitting elements, and two red light emitting elements.

10. A light emitting device, comprising:

a substrate comprising a plurality of leads provided on an insulating base;

a plurality of light emitting elements arranged substantially on a single base line along a surface of the substrate in a predetermined direction, wherein all light emitting elements mounted on said substrate are arranged on said single base line; and a plurality of bonding wires configured to connect the plurality of light emitting elements to the plurality of leads in the predetermined direction or on one side relative to the base line.

11. The light emitting device according to claim 10, wherein the substrate comprises a reflection case having an opening provided on a side thereof on which the plurality of light emitting elements are arranged and a seal member comprising a light transparent material configured to fill the opening in the reflection case to seal the plurality of light emitting elements in the reflection case, said opening configured to surround the plurality of light emitting elements and extending toward the side where the plurality of bonding wires are provided.

12. The light emitting device according to claim 10, wherein:

the substrate comprises a reflection case having an opening provided on its side where the plurality of light emitting elements are arranged, so as to surround the plurality of light emitting elements and be positioned toward the plurality of bonding wires; and a seal member comprising a light transparent material filled into the opening in the reflection case which seals the plurality of light emitting elements.

13. The light emitting device according to claim 10, wherein the substrate comprises a printed circuit board with the plurality of leads provided on the insulating base by a circuit printing method.

14. The light emitting device according to claim 10, wherein the substrate has a lead frame structure formed by placing a lead frame corresponding to the plurality of leads within a mold and pouring an insulating material into the mold.

15. The light emitting device according to claim 10, wherein:

the plurality of light emitting elements comprises one blue light emitting element, one or more green light emitting elements, and two or more red light emitting elements.

16. The light emitting device according to claim 10, wherein:

the plurality of light emitting elements comprises one blue light emitting element, two green light emitting elements, and two red light emitting elements.

17. A light emitting device comprising:

a first metal layer provided on an upper surface of an insulating base;

a second metal layer provided on a lower surface of the insulating base;

a plurality of light emitting elements arranged along a base line on a surface of the first metal layer in a predetermined direction; and a metal connection configured to connect the first and second layers to one another, said metal connection located at a position substantially directly beneath a location where a predetermined light emitting element of the plurality of light emitting elements is disposed.

18. The light emitting device according to claim 17, wherein the substrate comprises a reflection case having an opening provided on a side thereof on which the plurality of light emitting elements are arranged and a seal member comprising a light transparent material configured to fill the opening in the reflection case to seal the array of light emitting elements in the reflection case, said opening being configured to surround the plurality of light emitting elements and be positioned eccentrically toward the plurality of bonding elements.

19. The light emitting device according to claim 17, wherein the plurality of light emitting elements comprises one blue light emitting element, one or more green light emitting elements, and two or more red light emitting elements.

20. The light emitting device according to claim 17, wherein the plurality of light emitting elements comprises one blue light emitting element, two green light emitting elements, and two red light emitting elements.

21. A light emitting device for driving a plurality of LED chips disposed in an array to emit a mixed light including lights emitted from the plurality of LED chips, said light emitting device comprising:

an LED chip connection lead provided on an upper surface of an insulating base;

a power supply connection lead provided on a lower surface of the insulating base; and a link lead configured to connect the LED chip connection lead to the power supply connection lead between the upper and lower surfaces of the insulating base, wherein the LED chip connection lead comprises a plurality of separate leads connected respectively to the plurality of LED chips and a common lead connected to the plurality of LED chips by a common connection, the common lead being loaded with the plurality of LED chips and configured to absorb heat generated from the plurality of LED chips, a location of each LED chip on said common lead being based on a relative amount of heat dissipated by each LED chip in said plurality of LED chips.

22. The light emitting device according to claim 21, wherein:

the common lead has an elongated region having predetermined width and length sufficient to be loaded with the plurality of LED chips, the plurality of LED chips comprises a first plurality of LED chips having positive and negative electrodes on a light emitting face thereof and a second plurality of LED chips having positive and negative electrodes on a light emitting face and a substrate side thereof, and the first and second pluralities of LED chips are alternatively loaded into the elongated region of the common lead.

23. The light emitting device according to claim 22, wherein the link lead comprises a plurality of through-hole platings configured to connect the common lead to the power supply connection lead at a position adjacent to and below the plurality of first LED chips.

24. The light emitting device according to claim 21, wherein the link lead comprises a plurality of through-hole platings configured to connect the plurality of separate leads to the power supply connection lead.

25. The light emitting device according to claim 21, wherein the power supply connection lead comprises a common lead, which is connected to one of a power supply and a ground and a plurality of separate leads connected to the other one of the ground and the power supply.

26. A light emitting device comprising:

a first metal layer provided on an upper surface of an insulating base;

a second metal layer provided on a lower surface of the insulating base;

a plurality of light emitting elements arranged along a base line on a surface of the first metal layer in a predetermined direction;

a metal connection configured to connect the first and second layers to one another, said metal connection located at a position where a predetermined light emitting element of the plurality of light emitting elements is disposed; and at least one bonding wire that electrically connects at least one of said plurality of light emitting elements to said first metal layer.

27. A light emitting device comprising:

a first metal layer provided on an upper surface of an insulating base;

a second metal layer provided on a lower surface of the insulating base;

a plurality of light emitting elements arranged along a base line on a surface of the first metal layer in a predetermined direction;

a metal connection configured to connect the first and second layers to one another, said metal connection located at a position where a predetermined light emitting element of the plurality of light emitting elements is disposed;

a plurality of metal contacts on said upper surface on one side relative to said base line; and a corresponding plurality of bonding wires that respectively connect said metal contacts to corresponding said light emitting elements.

28. A light emitting device comprising:

a base;

a first metal pattern formed on a top surface of said base as a single region of metal;

a plurality of light emitting chips mounted on said first metal pattern;

a second metal pattern on said top surface, said second pattern having a number of regions corresponding in number to said plurality of light emitting chips;

a plurality of bonding wires, each electrically interconnecting one of said regions of said second metal pattern to one of said plurality of light emitting chips;

a third metal pattern formed on a bottom surface of said base as a single region of metal; and a fourth metal pattern on said bottom surface, said fourth pattern having a plurality of regions corresponding in number to said plurality of light emitting chips, wherein said first metal pattern and said third metal pattern are electrically interconnected by at least one metalized through-hole and each said region in said second metal pattern is electrically interconnected to a corresponding region in said fourth metal pattern by a metalized through-hole.

29. The light emitting device of claim 28, wherein each said at least one metalized through-hole interconnecting said first metal pattern and said third metal pattern is located directly below one of said plurality of light emitting chips.

30. The light emitting device of claim 28, wherein said first metal pattern comprises one of a "C" shape, an "H" shape, and an "L" shape.

31. A light emitting device, comprising:

lead patterns provided on top and bottom surfaces of an insulating base;

a lead for connecting the lead patterns; and a light emitting diode provided substantially directly over a location where the lead is positioned, the light emitting diode having first and second electrodes, one of which being connected to one of the lead patterns.

* * * * *